United States Patent [19]

Tanaka et al.

[11] Patent Number: 5,140,004
[45] Date of Patent: Aug. 18, 1992

[54] METHOD FOR PREPARING A HIGH TC SUPERCONDUCTING FIBER

[75] Inventors: Saburo Tanaka; Hideo Itozaki; Takeshi Yamaguchi; Shuji Yazu; Tetsuji Jodai, all of Itami, Japan

[73] Assignee: Sumitomo Electric Industries, Ltd., Japan

[21] Appl. No.: 717,020

[22] Filed: Jun. 18, 1991

Related U.S. Application Data

[62] Division of Ser. No. 291,733, Dec. 29, 1988, Pat. No. 5,079,718.

[30] Foreign Application Priority Data

Dec. 31, 1987 [JP] Japan ................. 62-336457

[51] Int. Cl.$^5$ ................. B05D 5/12; B32B 9/00
[52] U.S. Cl. ................. 505/1; 505/704; 505/731; 427/62; 427/407.2; 427/407.1; 427/419.2; 427/118; 204/192.24; 264/177.11; 264/332; 65/3.11; 428/432; 428/446; 428/701; 428/930
[58] Field of Search ................. 505/1, 704, 731; 204/192.24; 427/62, 407.2, 407.1, 419.2, 118; 29/599; 65/3.11; 428/432, 701, 930, 446; 264/177.11, 332

[56] References Cited

FOREIGN PATENT DOCUMENTS 63-271816 11/1988 Japan .

Primary Examiner—Shrive Beck
Assistant Examiner—Roy V. King
Attorney, Agent, or Firm—Jordan B. Bierman

[57] ABSTRACT

A method of preparing a high Tc superconducting fiber is disclosed, which comprises drawing into fiber form a core filament of a crystalline oxide, continuously depositing on the heated core filament a high Tc superconducting thin film and then depositing a protective layer on the outer surface of the high Tc superconducting thin film.

32 Claims, 3 Drawing Sheets

METHOD FOR PREPARING A HIGH TC SUPERCONDUCTING FIBER

This application is a division and claims the priority of U.S. application Ser. No. 291,733, filed Dec. 29, 1988, now U.S. Pat. No. 5,079,218, which, in turn, claims the priority of Japanese Application 336457/1987, filed Dec. 31, 1987.

BACKGROUND OF THE INVENTION

1. Field of the Invention

The present invention relates to a superconducting fiber or filament having superconducting property and a method for preparing the same.

2. Description of the Related Art

The superconductivity is a phenomenon which is explained to be a phenomenon of a kind of phase change of electrons under which the electrical resistance become zero and the perfect diamagnetism is observed. Thus, a variety of application of the superconductor have been proposed in every field.

Zero resistance which is the most important property of the superconductor can be advantageously utilized in a magnetic coil, a magnet in addition to a power cable. However, the critical temperature of the superconductors could not exceed 23.2K of $Nb_3Ge$ which was the highest Tc for the past ten years.

The possibility of an existence of new types of superconducting materials having much higher Tc was revealed by Bednorz and Müller, who discovered a new oxide type superconductor in 1986 [Z. Phys. B64 (1986) 189]

It was also reported that C. W. Chu et al. discovered, in the United States of America, another superconducting material so called YBCO type represented by $YBa_2Cu_3O_{7-x}$ having the critical temperature of in the order of 90K in February 1987. Still other type new superconducting materials which were reported recently are a compound oxide of Bi-Sr-Ca-Cu-O system and Tl-Ba-Ca-Cu-O system which exhibit such high Tc as more than 100K and which are chemically much stable than the abovementioned YBCO type compound oxide.

And hence, the application of the high-temperature superconductors will be enlarged remarkably.

These new type superconducting materials are, however, ceramic materials are produced by a sintering technique in which a compact of powder material is sintered in a furnace, so that they can not or are difficult to be shaped into a shape of wire or tape which can be used in practical uses.

Taking the abovementioned situation into consideration, the present inventors have proposed a process for manufacturing a ceramic wire in the following commonly assigned U.S. patent applications: Ser. No. 152,713 filed on Feb. 5, 1988 now abandoned, No. 161,480 filed on Feb. 29, 1988 now abandoned, No. 182,489 filed on Apr. 18, 1988, No. 189,366 filed on May 2, 1988, No. 225,207 filed on Jul. 28, 1988 now U.S. Pat. No. 5,030,616 or the like.

The above-mentioned compound oxide type superconductors possess an anisotropy property in their superconducting properties. It is known that the critical current density increase remarkably when the crystalline orientation in the compound oxides is correctly ordered. However, it is difficult to realize such high ordering of crystalline structure in sintered products. In fact, no particular control have not effected in the above-mentioned superconducting wires produced by the sintering technique.

An object of the present invention is to overcome the abovementioned problems of the conventional technique and to provide a new concept of superconducting fiber or filament and a process for producing the same.

SUMMARY OF THE INVENTION

A superconducting fiber according to the present invention comprises a core filament composed of an oxide and a superconducting thin film layer composed of superconducting compound oxide and deposited continuously on an outer surface of said core filament.

According to a preferred embodiment of the present invention, the core filament is composed of a crystalline oxide whose arrangement of atoms in a lattice plane is nearly matched with an arrangement of atoms in a predetermined lattice plane of a crystal of the superconducting compound oxide. The term "nearly matched" means that the arrangement of atoms in the lattice plane in the superconducting compound oxide is not necessarily identical with the arrangement of atoms in the lattice plane of the crystalline oxide of the core filament. The degree of the mismatching or difference in the arrangement of atoms between them is preferably less than 30% in an integer number.

The superconducting thin film used in the present invention is any superconducting compound oxide which can be deposited on the core filament.

For example, the superconducting thin film can be composed mainly of compound oxide represented by the general formula:

$$Ln_1Ba_2Cu_3O_{7-\delta}$$

in which Ln stands for at least one lanthanide element selected from a group comprising La, Nd, Sm, Eu, Gd, Dy, Ho, Y, Er and Yb and δ is a number which satisfies a range of $0 \leq \delta < 1$. More preferably, $Y_1Ba_2Cu_3O_{7-\delta}$, $Er_1Ba_2Cu_3O_{7-\delta}$, $Ho_1Ba_2Cu_3O_{7-\delta}$ and $Dy_1Ba_2Cu_3O_{7-\delta}$ ($0 \leq \delta < 1$). These compound oxides have perovskite type or quasiperovskite type crystalline structure. The term quasi-perovskite type means a structure which can be considered to have such a crystal structure that is similar to perovskite-type oxides and includes an orthorhombically distorted perovskite or a distorted oxygen-deficient perovskite or the like.

Another example of the superconducting compound oxide which is applicable to the present invention is compound oxide represented by the general formula:

$$(La_{1-x}\alpha_x)_2CuO_4$$

in which α stands for Ba or Sr and "x" is a number which satisfies a range of $0.01 \leq x \leq 0.2$, more particularly, $(La_{1-x}Ba_x)_2CuO_4$ or $(La_{1-x}Sr_x)_2CuO_4$ ($0.01 \leq x \leq 0.2$). These compound oxides have a crystalline structure of $K_2NiF_4$ type.

Still another example of the superconducting compound oxide which is applicable to the present invention is compound oxide represented by the general formula:

$$\Theta_4(\Phi_{1-q}, Ca_q)_m Cu_n O_{p+r}$$

in which Θ stands for Bi or Tl, Φ stands for Sr when Θ is Bi and stands for Ba when Θ is Tl, "m" and "n" are numbers each satisfying ranges of $6 \leq m \leq 10$ and $4 \leq n \leq 8$ respectively, $p=(6+m+n)$, "q" is a number which satisfies a range of $0<q<1$, and "r" is a number which satisfies a range of $-2 \leq r \leq +2$, more preferably $Bi_2Sr_2Ca_2Cu_3O_{10}$ or $Bi_4Sr_4Ca_4Cu_6O_{20}$, and $Tl_2Ba_2Ca_2Cu_3O_{10}$ or $Tl_4Ba_4Ca_4Cu_6O_{20}$. These compound oxides show very high critical temperatures of 80K to 125K.

The superconducting thin film according to the present invention can be composed mainly of the above-mentioned compound oxide. The term "mainly" means that the superconducting thin film according to the present invention can contain the other compound oxides having different compositions whose atomic ratio is modified by ±50%, preferably ±20% with respect to the definitions in respective formulas and also can contain inevitable impurities.

The thickness of superconducting thin film layer is preferably 0.1 to 500 μm.

The core filament is preferably composed of MgO, $SrTiO_3$, $ZrO_2$ or quartz or $SiO_2$, more preferably is made of a single crystal of these oxides in order to realize effectively the characteristic property of the present invention. The core filament has preferably an outer diameter of 0.01 to 0.5 mm.

High performance as a superconductor which have been difficult to be realized heretofore can be obtained by the present invention in which an effective superconducting crystalline structure can be realized on a support since the support is made of an oxide which has similar crystalline structure as the superconducting compound oxide.

In fact, the superconducting thin films of the above-mentioned type compound oxides shows anisotropy in the critical current density. Namely, the current passing along a direction which is in parallel with a plane defined by a-axis and b-axis of the crystal show a very high critical current density, while the current passing along c-axis is relatively lower. This means that it is preferable to match the crystalline orientation of the superconducting thin film with that of the core filament in order to realize higher critical density.

Therefore, according to another aspect of the present invention, the core filament is composed of a crystalline oxide whose arrangement of atoms in a lattice plane is "nearly matched" with an arrangement of atoms in a predetermined lattice plane of a crystal of said superconducting compound oxide. Such control of the arrangement of atoms on a surface of the core filament facilitate orientation of the superconducting compound oxide to be deposited on the surface of the core filament so that the current density along the longitudinal direction of the core filament is increased.

Therefore, the superconducting compound oxide layer is deposited continuously on the surface of the core filament in such a manner that the lattice plane containing a-axis and b-axis in the crystal of said superconducting compound oxide becomes in parallel with a longitudinal direction of said core filament. For example, the core filament of oxide preferably possesses [100] plane on at least a portion of the surface and has preferably a rectangular cross section. An outer diameter of the core filament is preferably 0.01 to 0.5 mm.

It is possible and preferable to cover the superconducting fiber according to the present invention with a protective layer. The outer lining or protective material can be of crosslinkable resin, thermosetting resin or UV curable resin such as silicon resin, acryl type resin or the like. These liquid type lining materials can be coated by any one of the conventional lining techniques such as spraying, dipping, coating or the like. For example, the liquid crosslinkable resin, thermosetting resin or UV curable resin having viscosity of 2,000 to 10,000 cp, preferably 2,500 to 3,500 cp is coated on the thin film and then is cured. The coating and curing operations are preferably repeated for several times.

The protective layer can be composed of the other materials such as glass, metal or the like. The protective layer may have a thickness of 1 to 100 mm. Still more the protective layer is further covered with an outer sheath made of abrasion-resisting material such as Nylon.

Now, we will describe a process for producing the superconducting fiber according to the present invention.

The process for producing the superconducting fiber according to the present invention comprise essentially two steps including a first step for preparing the core material oxide by "drawing method" and a second step for depositing the superconducting thin film layer composed mainly of compound oxide on a surface of the core filament obtained.

The "drawing method" is well-known in the field of glass fiber manufacturing industry and is performed by drawing a filament from a molten core material fused in a crucible or by drawing a portion of molten zone of a locally fused solid mother core rod or billet.

The superconducting thin film can be prepared by any one of the conventional thin film deposition techniques including physical vapour deposition technique, chemical vapour deposition technique or the like. In the case of the physical vapour deposition technique, sputtering process, preferably high-frequency sputtering, high-frequency magnetron sputtering or three- or four-electrodes sputtering process is preferably.

The sputtering condition depend on the nature of the core filament used and the nature of the superconducting compound oxide used.

Generally, the core filament is heated to a temperature of higher than 300° C., preferably 500° to 900° C. For example, in the case of Bi type compound oxide (Bi-Sr-Ca-Cu-O system), the thin film is deposited on a core filament heated to 700° C. and in the case of Tl-type compound oxide (Tl-Ba-Ca-Cu-O system), the thin film is deposited on a core filament heated to 400° C.

According to still another aspect of the present invention, the thin film deposited is further subjected to heat-treatment in order to improve the superconducting property. This heat-treatment is preferably carried out in oxygen-containing atmosphere at a temperature of 800° to 960° C. more preferably 850° to 950° C. for predetermined period. In the case of Tl-type compound oxide (Tl-Ba-Ca-Cu-O system), the oxygen-containing atmosphere contain preferably further a vapour of Tl or $Tl_2O_3$ in addition to oxygen in order to prevent the thallium vapour from escaping out of the deposited thin film since the partial pressure of thallium (Tl) is higher than the other metal elements.

Generally, the above-mentioned basic two steps of the present invention, namely the first step for preparing the core material oxide and the second step for depositing the superconducting thin film layer are performed independently because the manufacturing speed of the first step is faster than the second step. However, it is possible to perform the two steps continuously in line. In this case, in order to match the two manufacturing speeds or compensate the difference in production rate between two steps, the slower stage of film deposition is carried out in a long manufacturing line or in a plurality of deposition stations.

In order to assure the continuity of the superconducting thin film deposited, the deposition of the thin film is preferably effected from several directions around the surface of the core filament. Therefore, in the case when the superconducting thin film is deposited by physical vapour deposition technique such as sputtering process, the core filament is surrounded by a plurality of targets arranged perpendicularly to each other or by a ring-shaped target.

Now, we will describe the present invention with reference to the attached drawings:

BRIEF DESCRIPTION OF THE DRAWINGS

FIGS. 2A and 2B illustrate two cross sectional views showing two example of the superconducting fiber according to the present invention, in which FIG. 2A illustrates a cross section of a superconducting fiber having a amorphous or polycrystal core filament, while FIG. 2B illustrates a cross section of a superconducting fiber having a single crystal core filament.

FIG. 1 is an illustrative view of an assembly of elemental apparatuses which are used in a process for producing the superconducting fiber according to the present invention. In actual manufacturing plant, each of the apparatuses shown in In FIG. 1 may be instaled separately. When the superconducting fiber is produced continuously in the assembly shown in FIG. 1, the relative positions and lengths among the unit machines should be modified accordingly.

An oxide for a core filament is fused in a platinum crucible 2 surrounded by a heater 1 and molten oxide material is drawn out of a nozzle 3 arranged at the bottom of the crucible 2 so that a core filament having a desired cross section is obtained. Usually, this core filament forming stage is performed independently because this first step can be performed relatively rapidly in comparison to the next second step. In FIG. 1, this stage is shown directly before the next stage for the purpose of illustration only.

In the second step, a superconducting thin film layer is deposited on a surface of the core filament. In FIG. 1, the deposition of the superconducting thin film is performed by high-frequency sputtering machine 4 surrounding the core filament. The high-frequency sputtering machine 4 comprises two paired sputtering units 4a, 4b. Each of paired sputtering units (in the drawing, only a pair units 4a, 4b are shown) is arranged at opposite sides of the core filament so that two thin films are deposited on opposite surfaces of one core filament simultaneously.

Figure 1:
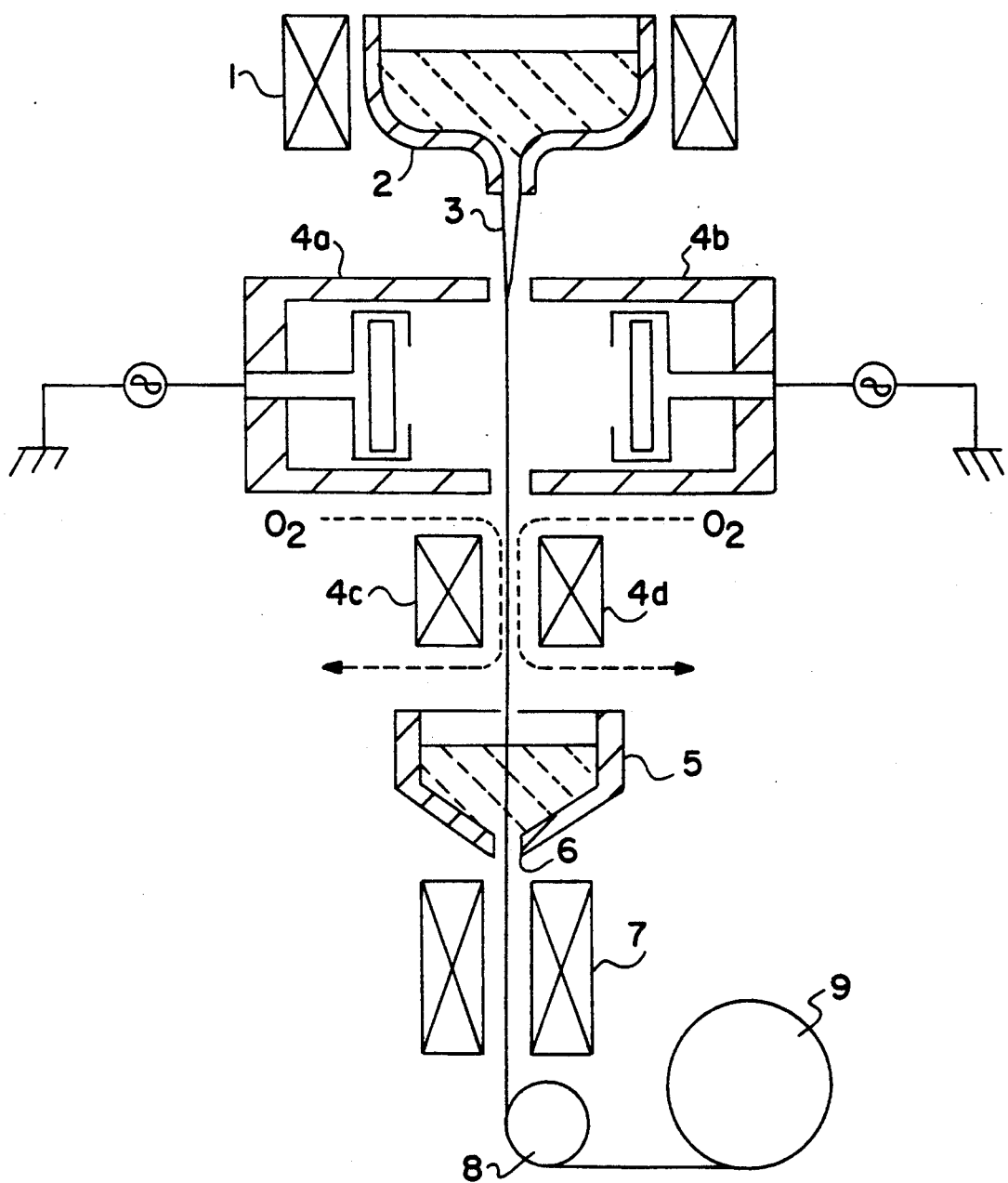
FIG. 1 illustrates a conceptional drawing showing elemental apparatuses used in a process for producing the superconducting fiber according to the present invention.

A vacuum chamber of the high-frequency sputtering machine 4 is provided with a pair of inlet and outlet doors which are actuated by differential pressure and also is provided with an oxygen gas inlet (all of which are not shown in FIG. 1).

The core filament is heated at a predetermined temperature before or during the sputtering operation. This heating of the core filament can be carried out by a heater (not shown) or by latent heat which is given in the first stage. Namely, if the sputtering operation is carried out directly after the core filament forming stage, the heating operation of the core filament can be eliminated.

A thin film deposited is then heat-treated by heaters 4c, 4d while oxygen gas ($O_2$) stream is flown. The oxygen gas is preferably flown towards the direction of downstream in order to accelerate quenching of the deposited thin film.

In FIG. 1, an additional protective layer coating station is also illustrated. In the drawing, the core filament having a superconducting thin film thereon is passed through a bath of thermosetting resin or UV curable resin stored in a container 5, so that a protective layer of resin is formed around a surface of the superconducting thin film and is cured by a curing unit 7 such as a heater or a UV tunnel.

When the superconducting fiber obtained is very fine and possesses enough flexibility, the product can be wound about a bobbin 9.

Now, we will show an example how to produce the superconducting fiber according to the present invention.

PREPARATION OF CORE FILAMENT

A superconducting thin film layer is deposited on the following three core filament samples: (1) sample 1: a core filament of amorphous MgO, (2) sample 2: a core filament of single crystal MgO and (3) sample 3: a core sample of round stainless steel wire each having an outer diameter (or a side) of 100 μm.

Figure 2A:
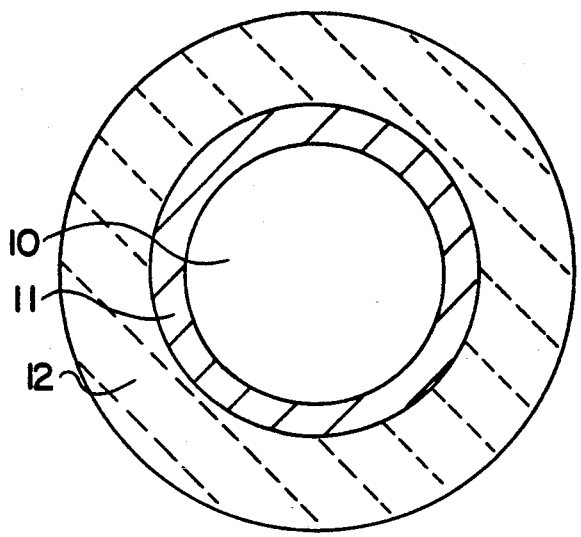
Figure 2B:
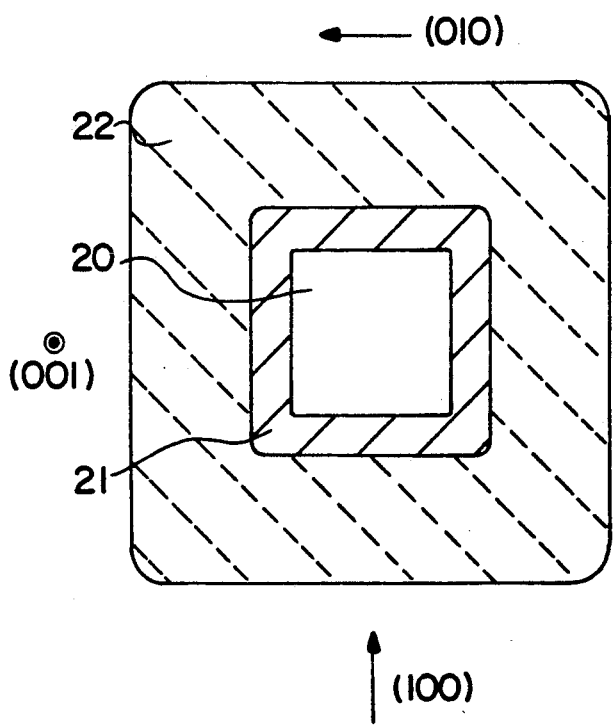

Sample 1 has a round cross section as is shown in FIG. 2A, while the sample 2 has a rectangular cross section as is shown in FIG. 2B. Both sample 1 and 2 have a core filament 10 or 20, a superconducting thin film layer 11 or 21 and a protective coating layer 12 or 22 respectively.

Figure 3A:
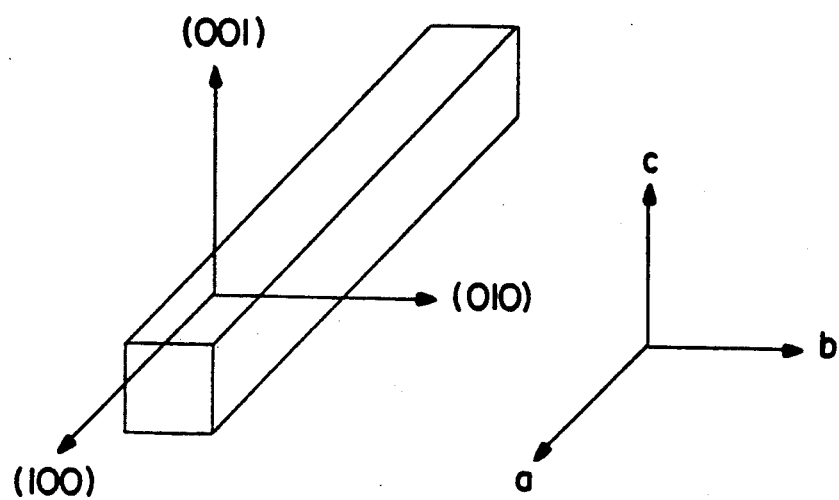
FIGS. 3A and 3B illustrates the orientation of a crystal which is used in the core filament shown in FIG. 2B.

The MgO single crystal core filament 20 of the sample 2 has nearly a square cross section and is formed in such a manner that [001] is directed to the longitudinal direction, while two paired parallel sides has [100] and [010] respectively as is shown in FIG. 3A so that c-axis is directed perpendicularly with respect to a surface of the core filament 20.

Figure 3B:
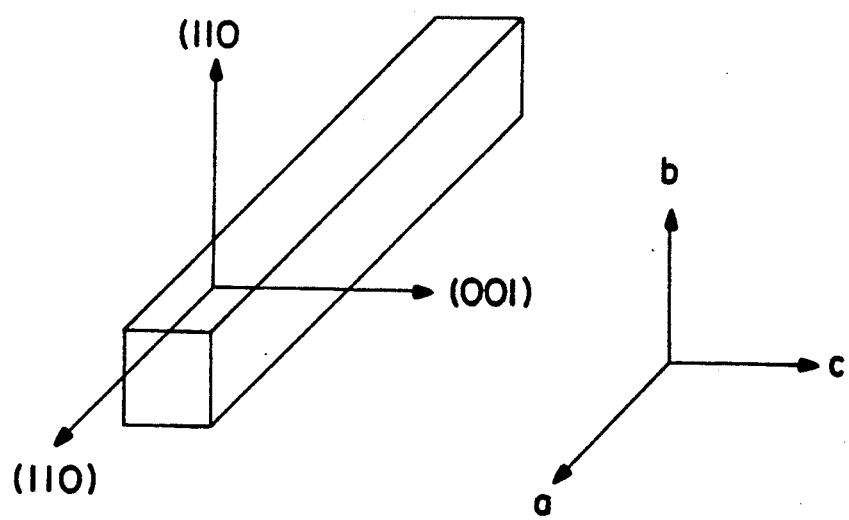

The orientation of crystal is not necessarily same as the above example in which c-axis is directed perpendicularly to the deposition surface, provided that a plane defined by a-axis and b-axis is in parallel with the longitudinal direction of the core filament. For example, the core filament may have a crystalline orientation such as shown in FIG. 3B in which [1$\bar{1}$0] is directed along the longitudinal direction, while side surfaces of the core filament have [110] and [001] respectively.

PREPARATION OF THE SUPERCONDUCTING THIN FILM (1)

The superconducting thin film is deposited by a sputtering machine 4 by using a target made of a sintered ceramic which is prepared by sintering a powder mixture containing Ho, Ba and Cu in an atomic ratio of Ho:Ba:Cu=1:2:4 under the following sputtering conditions:

| Sputtering gas | $O_2/Ar = \frac{1}{4}$ |
| --- | --- |
| Sputtering gas pressure | 0.01 to 0.1 Torr |
| High-frequency power | 0.5 W/cm$^2$ |

The sputtering is preferably carried out when the core filament which is produced from molten material fused at about 2,800° C. is cooled down to a temperature of about 700° C.

The deposited thin film is then heat-treated in a heater 4c, 4d in oxygen gas stream at 900° C. in order to produce an effective superconductor.

The superconducting fiber is then passed through ultraviolet curable acrylate resin having a viscosity of 3,000 pois which is then cured. This protective layer costing operation can be repeated for several times until a desired thickness of the protective coating layer is obtained.

The core filament may have an outer diameter of 0.01 to 0.5 mm, the superconducting thin film layer of compound oxide may have a thickness of 0.1 to 500 μm and the protective layer may have a thickness of 1 to 100 mm. In the case of the above-mentioned samples, they have the following dimensions before an outer sheath of nylon 12 is lined to the final diameter of 1 mm:

|  | Outer diameter of core filament | Thickness of superconducting film | Outer diameter of protective layer |
|---|---|---|---|
| Sample 1 | 100 μm | 2 μm | 400 μm |
| Sample 2 | 100 μm (side) | 2 μm | 350 μm (a side) |
| Sample 3 | 100 μm | 2 μm | 400 μm |

A test piece having a predetermined length is cut from respective sample to determine the superconducting properties. The result is shown in Table 1. The critical temperature is determined by usual four probe method. The critical current density is determined at 77.0K and is expressed by $A/cm^2$. Namely, electric resistance is measured with increasing the amount of current and a value of the current intensity where resistance detected at first is divided by a cross sectional area through which current pass.

TABLE 1

|  | Critical temperature (K) | | Critical current density $(A/cm^2)$ |
|---|---|---|---|
|  | on set | zero resistance |  |
| Sample 1 | 95 | 83 | $10^3$ |
| Sample 2 | 95 | 84 | $10^6$ |
| Sample 3 | 80 | — | — |

(Note):
Zero resistance can not be measured on the sample 3 (comparative example) because the deposited film is poor in quality.

PREPARATION OF THE SUPERCONDUCTING THIN FILM (2)

The following core filament samples 4 and 5 each having a rectangular cross section are used:

|  | Outer diameter of core filament | Thickness of superconducting film | Outer diameter of protective layer |
|---|---|---|---|
| Sample 4 | 100 μm (a side) | 2 μm | 400 μm (a side) |
| Sample 5 | 100 μm (a side) | 2 μm | 400 μm (a side) |

Then, Tl-Ba-Ca-Cu-O system ceramic target (Sample 4) and Bi-Sr-Ca-Cu system ceramic target (Sample 5) are used in place of Ho-Ba-Cu-O system ceramic target in the preparation method (1). Each target has the following atomic ratio:

| Sample 3: Tl—Ba—Ca—Cu—O system | Tl:Ba:Ca:Cu = 6.7:2:2:3 |
|---|---|
| Sample 4: Bi—Sr—Ca—Cu—O system | Bi:Sr:Ca:Cu = 1.4:1:1:1.5 |

Sputtering is carried out under the following sputtering conditions:

| Sputtering gas | $O_2/Ar$ = 2/8 |
|---|---|
| Sputtering gas pressure | 0.02 Torr |
| High-frequency power | 0.2 W/$cm^2$ |
| Deposition rate | 0.2 Å /sec |

A test piece having a predetermined length is cut from respective sample to determine the superconducting properties by the same method as above. The result is shown in Table 2.

TABLE 2

|  | Critical temperature (K) | | Critical current density $(A/cm^2)$ |
|---|---|---|---|
|  | on set | zero resistance |  |
| Sample 4 | 125 | 110 | $1.2 \times 10^6$ |
| Sample 5 | 110 | 95 | $1.0 \times 10^6$ |

We claim:

1. A process for the production of a superconducting fiber comprising drawing into fiber form a core filament comprising a crystalline oxide selected from the group consisting of MgO, $SrTiO_3$, $ZrO_2$, $SiO_2$, and quartz, continuously depositing, at elevated temperature, on an outer surface of said core filament a high Tc superconducting thin film layer which is mainly a high Tc superconducting compound oxide, and depositing a protective layer on an outer surface of said high Tc superconducting thin film layer,
   said crystalline oxide having an arrangement of atoms in a lattice plane nearly matched by an arrangement of atoms in a predetermined lattice plane of a crystal of said high Tc superconducting compound oxide, mismatching of said arrangement of atoms in said lattice plane in said high Tc superconducting compound oxide and said lattice plane in said crystalline oxide of said core filament being less than 30%.

2. The process of claim 1 wherein said core filament is drawn from molten core material.

3. The process of claim 2 wherein said material is drawn from a crucible.

4. The process of claim 2 wherein said molten material is drawn from a molten zone of locally fused solid core material.

5. The process of claim 1 wherein said core filament has an outer diameter of 0.01 to 0.5 mm.

6. The process of claim 1 wherein said high tc superconducting layer is deposited by physical vapor deposition.

7. The process of claim 6 wherein said deposition is by sputtering.

8. The process of claim 7 wherein said deposition is by high frequency sputtering.

9. The process of claim 8 wherein said deposition is by magnetron sputtering.

10. The process of claim 1 wherein said thin film layer is formed by depositing a plurality of times.

11. The process of claim 1 wherein said thin film layer is deposited from at least two directions.

12. The process of claim 6 wherein a cylindrical target is used.

13. The process of claim 1 wherein, after being deposited, said thin film layer is subjected to heat treatment.

14. The process of claim 13 wherein said heat treatment is carried out in an oxygen atmosphere.

15. The process of claim 13 wherein said heat treatment is carried out at a treatment temperature of 800° to 960° C.

16. The process of claim 15 wherein said treatment temperature is 850° to 950° C.

17. The process of claim 1 wherein said lattice plane contains a-axis and b-axis in the crystal of said compound oxide and is parallel to a longitudinal direction of said core filament.

18. The process of claim 1 wherein said core filament is a single crystal.

19. The process of claim 1 wherein said core filament has a [100] plane which is continuous along its longitudinal direction on at least a portion of said outer surface of said core filament.

20. The process of claim 1 wherein said core filament has a rectangular cross section.

21. The process of claim 18 wherein said core filament is of MgO having a rectangular cross section and having a [100] plane in its longitudinal direction as and [100], [0$\bar{1}$0] planes and [010], [0$\bar{1}$0] planes on its paired side surfaces.

22. The process of claim 1 wherein said thin film layer is composed mainly of said compound oxide represented by the general formula:

$$Ln_1Ba_2Cu_3O_{7-\delta}$$

in which Ln is at least one lanthanide element selected from the group constituting of La, Nd, Sm, Eu, Gd, Dy, Ho, Y, Er, and Yb and $\delta$ is a number from 0 to 1.

23. The process of claim 1 wherein said thin film layer is composed mainly of compound oxide represented by the general formula:

$$(La_{1-x}\alpha_x)_2CuO_4$$

wherein $\alpha$ is Ba or Sr, and x is a number from 0.01 to 0.2.

24. The process of claim 1 wherein said thin film layer is composed mainly of compound oxide represented by the general formula:

$$\Theta_4(\Phi_{1-q}Ca_q)_mCu_nO_{p+r}$$

in which $\Theta$ stands for Bi or Tl, $\Phi$ stands for Sr when $\Theta$ is Bi and stands for Ba when $\Theta$ is Tl, m and n are 6 to 10 and 4 to 8, respectively, $p=(6+m+n)$, q is 0 to 1, and r is $-2$ to $+2$.

25. The process of claim 24 wherein said compound oxide is $Bi_2Sr_2Ca_2Cu_3O_{10}$.

26. The process of claim 24 wherein said compound oxide is $Tl_2Ba_2Ca_2Cu_3O_{10}$.

27. The process of claim 1 wherein said thin film layer has a thickness of 0.1 to 500 μm.

28. The process of claim 1 wherein said protective layer is composed of crosslinkable resin, thermosetting resin, or UV curable resin.

29. The process of claim 1 characterized in that said crosslinkable resin is silicon resin or acryl type resin.

30. The process of claim 1 wherein said protective layer is of glass.

31. The process of claim 1 wherein said protective layer has a thickness of 1 to 100 mm.

32. The process of claim 1 wherein said protective layer is formed by depositing a plurality of times.

* * * * *